（12） United States Patent
Chen et al.

(10) Patent No.: US 12,525,581 B2
(45) Date of Patent: Jan. 13, 2026

(54) POP STRUCTURE OF THREE-DIMENSIONAL FAN-OUT MEMORY AND PACKAGING METHOD THEREOF

(71) Applicant: SJ Semiconductor(Jiangyin) Corporation, Jiangyin (CN)

(72) Inventors: Yenheng Chen, Jiangyin (CN); Chengchung Lin, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 396 days.

(21) Appl. No.: 18/132,581

(22) Filed: Apr. 10, 2023

(65) Prior Publication Data

US 2023/0352450 A1   Nov. 2, 2023

(30) Foreign Application Priority Data

Apr. 29, 2022   (CN) .......................... 202210475762.1

(51) Int. Cl.
*H01L 21/56*   (2006.01)
*H01L 23/00*   (2006.01)
(Continued)

(52) U.S. Cl.
CPC .......... *H01L 25/0657* (2013.01); *H01L 21/56* (2013.01); *H01L 23/296* (2013.01); *H01L 23/3135* (2013.01); *H01L 24/03* (2013.01); *H01L 24/05* (2013.01); *H01L 24/11* (2013.01); *H01L 24/14* (2013.01); *H01L 24/45* (2013.01); *H01L 24/73* (2013.01); *H10B 80/00* (2023.02); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/32145* (2013.01); *H01L 2224/325* (2013.01); *H01L 2224/48091* (2013.01); *H01L 2224/48227* (2013.01);
(Continued)

(58) Field of Classification Search
CPC . H01L 25/0657; H01L 21/56; H01L 23/3135; H01L 23/296; H01L 24/03; H01L 24/11; H01L 24/05; H01L 24/14; H01L 24/45; H01L 24/73; H10B 80/00
See application file for complete search history.

(56) References Cited

U.S. PATENT DOCUMENTS

2019/0122990 A1*   4/2019   Shin ........................ H01L 24/92

* cited by examiner

Primary Examiner — Walter H Swanson
(74) Attorney, Agent, or Firm — IPRTOP LLC

(57) ABSTRACT

The package-on-package (POP) structure includes a first package unit of three-dimensional fan-out memory chips and a SiP package unit of the two-dimensional fan-out peripheral circuit chip. The first package unit includes: memory chips laminated in a stepped configuration; a molded substrate; wire bonding structures; a first rewiring layer; a first encapsulating layer; and first metal bumps, formed on the first rewiring layer. The SiP package unit includes: a second rewiring layer; a peripheral circuit chip; a third rewiring layer, bonded to the circuit chip; first metal connection pillars; a second encapsulating layer for the circuit chip and the first metal connection pillars; and second metal bumps on the second rewiring layer. The first metal bumps are bonded to the third rewiring layer. Integrating the two package units into the POP is enabled by three rewiring layers and the molded substrate which supports the first package unit during wire bonding process.

4 Claims, 2 Drawing Sheets

(51) Int. Cl.
*H01L 23/29* (2006.01)
*H01L 23/31* (2006.01)
*H01L 25/065* (2023.01)
*H10B 80/00* (2023.01)

(52) U.S. Cl.
CPC ............... *H01L 2224/48644* (2013.01); *H01L 2224/48647* (2013.01); *H01L 2224/73265* (2013.01); *H01L 2225/06506* (2013.01); *H01L 2924/15311* (2013.01)

POP STRUCTURE OF THREE-DIMENSIONAL FAN-OUT MEMORY AND PACKAGING METHOD THEREOF

CROSS REFERENCE TO RELATED APPLICATION

The present application claims the benefit of priority to Chinese Patent Application No. CN 202210475762.1, entitled "POP STRUCTURE OF THREE-DIMENSIONAL FAN-OUT MEMORY AND PACKAGING METHOD THEREOF", filed with CNIPA on Apr. 29, 2022, the disclosure of which is incorporated herein by reference in its entirety.

FIELD OF TECHNOLOGY

The present disclosure relates to the technical field of semiconductor packaging, in particular, to a package-on-package (POP) structure of a three-dimensional fan-out memory device and a packaging method thereof.

BACKGROUND

In traditional substrate manufacturing, the printed circuit boards (PCBs) are used to support electronic components, and are carriers for the electrical connection of electronic components. In batch applications, the number of substrate layers is usually not more than 12 layers. The more chip I/Os are on the substrates, the more substrate layers will be needed, and the higher the overall cost will result in. The production process also has certain limits. Currently, the line width/line spacing have minimum set at 20 µm/20 µm more often apply 50 µm/50 µm. And with the rapid development of integrated circuit manufacturing technology, the front-end process of integrated circuits has chased the limits of Moore's Law, and reaching the physical limit of lithography exposure of the process. As the front-end chip manufacturing is capable at an increasingly higher integration level in functions, the current substrate technology will no longer be able to support the integrating requirements of the front-end chip manufacturing. Therefore, various advanced packaging techniques have been developed, such as the 2.5D & fan-out wafer level advanced packaging technologies, ball grid array packaging (BGA) technologies, chip size packaging (CSP) technologies, wafer level packaging (WLP) technologies and the like. However, these technologies are more expensive and take longer to manufacture than substrate manufacturing techniques.

SUMMARY

The present disclosure provides a package-on-package (POP) structure, which includes: a first package unit including three-dimensional fan-out memory chips, and a system-in-package (SiP) package unit including at least one two-dimensional fan-out peripheral circuit chip, and the first package unit and the SiP package unit are bonded together.

The first package unit of the three-dimensional fan-out memory chips includes: at least two memory chips laminated in a stepped configuration, each of the at least two memory chips being provided with a bonding pad arranged on a step surface of the stepped configuration; a molded substrate having a first surface and a second surface, the first surface of the molded substrate being bonded to the bonding pad of one of the at least two memory chips that is at a step of the stepped configuration; wire bonding structures, each of the wire bonding structures having one end electrically connected to the bonding pad of said memory chip, and another end electrically connected with the first surface of the molded substrate; a first rewiring layer having a first surface and a second surface, the first surface of the first rewiring layer being provided under the second surface of the molded substrate; a first encapsulating layer, encapsulating the at least two memory chips and the wire bonding structures; and first metal bumps, formed on the second surface of the first rewiring layer.

The SiP package unit of the two-dimensional fan-out peripheral circuit chip includes: a second rewiring layer having a first surface and a second surface; at least one peripheral circuit chip, arranged in two dimensions and electrically connected with the first surface of the second rewiring layer; a third rewiring layer having a first surface and a second surface, the second surface of the third rewiring layer being bonded to the at least one peripheral circuit chip; first metal connection pillars, provided on an outside of the at least one peripheral circuit chip, each of the first metal connection pillars having one end electrically connected with the first surface of the second rewiring layer, and another end electrically connected with the second surface of the third rewiring layer; a second encapsulating layer, encapsulating the at least one peripheral circuit chip and the first metal connection pillars; and second metal bumps, formed on the second surface of the second rewiring layer.

The first metal bumps are bonded to the first surface of the third rewiring layer to achieve bonding between the first package unit of the three-dimensional fan-out memory chips and the SiP package unit of the two-dimensional fan-out peripheral circuit chip.

The present disclosure further provides a method of packaging a package-on-package (POP) structure, which includes at least the following steps:

Forming a first package unit of the three-dimensional fan-out memory chips; and forming a system-in-package (SiP) package unit of the two-dimensional fan-out peripheral circuit chip.

The first package unit of the three-dimensional fan-out memory chips includes: at least two memory chips laminated in a stepped configuration, each of the at least two memory chips being provided with a bonding pad arranged on a step surface of the stepped configuration; a molded substrate having a first surface and a second surface, the first surface of the molded substrate being bonded to the bonding pad of one of the at least two memory chips that is at a step of the stepped configuration; wire bonding structures, each of the wire bonding structures having one end electrically connected to the bonding pad of said memory chip, and another end electrically connected with the first surface of the molded substrate; a first rewiring layer having a first surface and a second surface, the first surface of the first rewiring layer being provided under the second surface of the molded substrate; a first encapsulating layer, encapsulating the at least two memory chips and the wire bonding structures; and first metal bumps, formed on the second surface of the first rewiring layer.

The SiP package unit of the two-dimensional fan-out peripheral circuit chip includes: a second rewiring layer having a first surface and a second surface; at least one peripheral circuit chip, arranged in two dimensions and electrically connected with the first surface of the second rewiring layer; a third rewiring layer having a first surface and a second surface, the second surface of the third rewiring layer being bonded to the at least one peripheral circuit chip; first metal connection pillars, provided on an outside of the at least one peripheral circuit chip, each of the first metal connection pillars having one end electrically connected with the first surface of the second rewiring layer, and another end electrically connected with the second surface of the third rewiring layer; a second encapsulating layer, encapsulating the at least one peripheral circuit chip and the first metal connection pillars; and second metal bumps, formed on the second surface of the second rewiring layer.

The method of packaging the POP structure further includes: bonding the first metal bumps to the first surface of the third rewiring layer to achieve bonding of the first package unit of the three-dimensional fan-out memory chips to the SiP package unit of the two-dimensional fan-out peripheral circuit chip.

In summary, the POP structure of the three-dimensional fan-out memory and the packaging method thereof according to the present disclosure adopts a fan-out pattern and realizes a package-on-package (POP) structure by rewiring layers in which a three-dimensional fan-out memory package unit and a two-dimensional fan-out peripheral circuit chip SiP package unit are bonded together, thereby obtaining a memory-encapsulated POP structure. In addition, the memory chip can be electrically connected to the rewiring layers by a wire bonding technique, and the entire package structure does not require through-silicon-vias (TSVs) holes for circuit lead-outs, which eliminates the circuit substrate required for traditional electronic component packaging, allows for high-density and high-integration device packaging, and enables the minimum line width/line spacing to be reduced to 1.5 μm/1.5 μm. Thus the process time can be shortened, and the efficiency increased. Further, the full package thickness dimension can be significantly reduced. Moreover, a molded substrate is used to connect the wire bonding structures, which improves the wire bonding yield and avoids damage to the rewiring layers because the molded substrate is less likely to dent during wire bonding due to its structure hardness. Finally, it is possible to realize a one-stop packaging process in which substrate is used to support the back-end-of-line (BEOL) instead of the middle-end-of-line (MEOL).

Description of reference numerals

Figure 1:
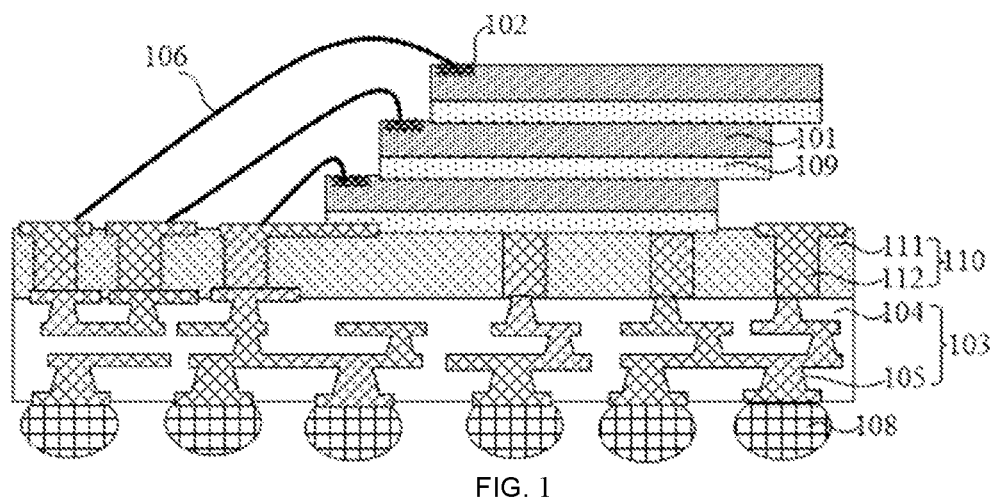
FIG. 1 shows a schematic diagram of a package unit for a three-dimensional fan-out memory device before encapsulation according to the present disclosure.

10 Three-dimensional fan-out memory package unit
101 Memory chip
102 Bonding pad Description of reference numerals 103 First rewiring layer
104 Dielectric layer
105 Metal wiring layer
106 Wire bonding structure
107 First encapsulating layer
108 First metal bump
109 Bonding layer
110 Molded substrate
111 Third encapsulating layer
112 Second metal connection pillar
20 Two-dimensional fan-out peripheral circuit chip SiP package unit
201 Second rewiring layer
202 Peripheral circuit chip
203 Third rewiring layer
204 Second encapsulating layer
205 Second metal bump
206 First metal connection pillar
207 Bottom filler layer
208 Bonding layer

DETAILED DESCRIPTION

The embodiments of the present disclosure will be described below. Those skilled in the art can easily understand other advantages and effects of the present disclosure according to contents disclosed by the specification. The present disclosure may also be implemented or applied through other different specific implementation modes. Various modifications or changes may be made to all details in the specification based on different points of view and applications without departing from the spirit of the present disclosure.

Please refer to FIGS. 1-4. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be changed according to actual needs, and the component layout configuration thereof may be more complicated.

Embodiment 1

As shown in FIGS. 1-4, various structures forming a POP structure for a three-dimensional fan-out memory device are disclosed. The structures include: a three-dimensional fan-out memory package unit 10 before encapsulation in FIG. 1 and after encapsulation in FIG. 2, and a two-dimensional fan-out peripheral circuit chip SiP package unit 20 FIG. 3, which is bonded to the three-dimensional fan-out memory package unit 10 in FIG. 4.

Figure 2:
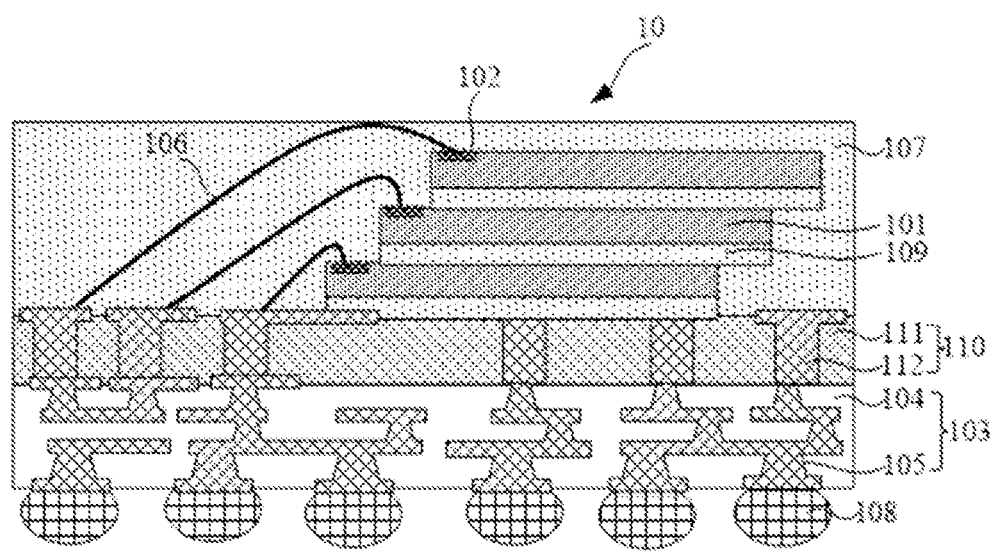
FIG. 2 shows a schematic diagram of the package unit for the three-dimensional fan-out memory device after encapsulation according to the present disclosure.

As shown in FIG. 2, the three-dimensional fan-out memory package unit 10 includes: at least two memory chips 101, although three memory chips are shown in the figures, laminated in a stepped configuration, each of the at least two memory chips 101 being provided with bonding pads 102, each chip 101 is arranged on a step surface of the stepped configuration; a molded substrate 110 having a first surface and a second surface, the first surface is bonded to each of the memory chips 101 at its step surface respectively; wire bonding structures 106, one end of each of the wire bonding structures 106 is electrically connected to the bonding pad 102 of the corresponding memory chip 101, and another end of each of the wire bonding structures 106 is electrically connected with the first surface of the molded substrate 110; a first rewiring layer 103 having a first surface and a second surface, the first surface of the first rewiring layer 103 is located under the second surface of the molded substrate 110; a first encapsulating layer 107, encapsulating the memory chips 101 and the wire bonding structures 106; and the first metal bumps 108, formed under the second surface of the first rewiring layer 103.

Figure 3:
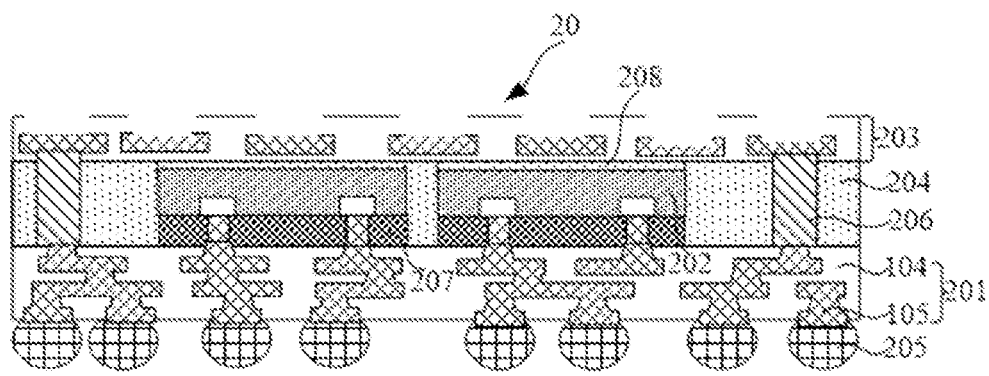
FIG. 3 shows a schematic diagram of a SiP package unit of a two-dimensional fan-out peripheral circuit chip for the three-dimensional fan-out memory device according to the present disclosure.

As shown in FIG. 3, the SiP package unit 20 for the two-dimensional fan-out peripheral circuit chip includes: a second rewiring layer 201 having a first surface over a second surface; at least one peripheral circuit chip 202, although two such chips are shown in FIG. 3, are arranged in two dimensions and electrically connected with the first surface of the second rewiring layer 201; a third rewiring layer 203 having a first surface over a second surface, the second surface of the third rewiring layer 203 is bonded to the peripheral circuit chip 202; the first metal connection pillars 206, located away from the outside of the peripheral circuit chip 202, each of the first metal connection pillars 206 has one end electrically connected with the first surface of the second rewiring layer 201, and another end electrically connected with the second surface of the third rewiring layer 203; a second encapsulating layer 204, which encapsulates the peripheral circuit chip 202 and the first metal connection pillars 206; and the second metal bumps 205, which are formed on the second surface of the second rewiring layer 201.

Figure 4:
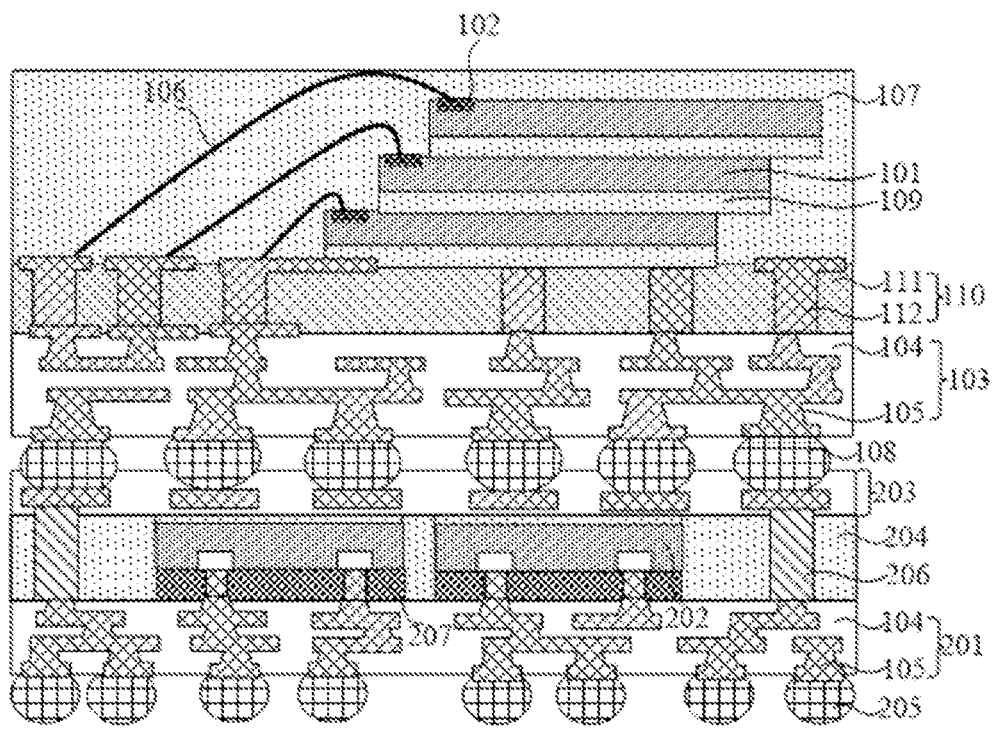
FIG. 4 shows a schematic diagram of a POP structure integrating the package unit of the three-dimensional fan-out memory device and the SiP package unit for the two-dimensional fan-out peripheral circuit chip, according to the present disclosure.

As shown in FIG. 4, the first metal bumps 108 are bonded to the first surface of the third rewiring layer 203 to achieve bonding between the three-dimensional fan-out memory package unit 10 to the two-dimensional fan-out peripheral circuit chip SiP package unit 20, to form the integrated POP structure.

The POP structure of the three-dimensional fan-out memory provided in this Embodiment adopts a fan-out pattern and realizes a package-on-package (POP) structure by two rewiring layers in which a three-dimensional fan-out memory package unit 10 and a two-dimensional fan-out peripheral circuit chip SiP package unit 20 are connected, thereby obtaining a memory-encapsulated POP structure. In addition, the memory chips can be electrically connected to the first rewiring layer by a wire bonding technique, and TSV holes are not required in the entire package structure for any circuit lead-out. This eliminates the circuit substrate required for traditional electronic component packaging, enables high-density and high-integration device packaging, and achieves the minimum line width/line spacing reduction to 1.5 μm/1.5 μm. As a result, the process time will be shortened, and efficiency increased. Further, the overall thickness dimension of the package structure will be significantly reduced. Moreover, the molded substrate 110 is used to support connections to the wire bonding structures 106. This interconnecting technique improves the wire bonding yield and avoids damage to the underneath rewiring layers, because the molded substrate is a strong piece, so less likely to dent during wire bonding process due to its hardness. Finally, this POP structure makes it possible to realize a one-stop packaging process in which a substrate is used to support the back-end-of-line (BEOL) instead of the middle-end-of-line (MEOL).

The memory chips 101 can be a memory chip suitable for three-dimensional lamination, such as DRAM, SRAM, flash memory, EEPROM, PRAM, MRAM and RPAM. In addition, the functions of the memory chip 101 in each layer of the laminated memory chips in the stepped configuration may be the same or different, the sizes of the memory chips 101 in each layer may be the same or different, and the sizes of the step surface of the memory chips 101 in each layer can be the same or different. The above parameters may be set according to the specific requirements of the package structure. The peripheral circuit chip 202 is mainly used to drive and control the memory chips 101. The peripheral circuit chip 202 may include peripheral circuit transistors and peripheral logic circuits. The peripheral logic circuits may include, but are not limited to, static random access memory (SRAM), phase locked loop (PLL), central processing unit (CPU), field programmable gate array (FPGA), etc. The design of the peripheral logic circuits depends on the different chips and functions.

As shown in FIGS. 1-2, as an example, the molded substrate 110 includes: the third encapsulating layer 111, and the second metal connection pillars 112 molded in the third encapsulating layer 111. Each of the second metal connection pillars 112 has one end protruded from the first surface of the molded substrate 110 and connected with the wire bonding structures 106 and another end connected with the first surface of the first rewiring layer 103. The third encapsulating layer 111 has a stronger hardness than that of the wire bonding structures 106, preventing the entire molded substrate 110 from being dented during the wire bonding process, thus improving the quality of the wire bonding. The material of the third encapsulating layer 111 generally has strong hardness and good insulation performance, and is the same as or similar to the material of the first encapsulating layer 107, such as one of polyimide, silicone and epoxy resin. The material of the second metal connection pillars 112 may possess good conductivity, t does not cause outward diffusion, and be the same as or similar to the metallic material in the first rewiring layer 103, such as one of gold, silver, aluminum, and copper.

As shown in FIG. 3, the first metal connection pillar 206 serves as an electrical connection conduit between the second rewiring layer 201 and the third rewiring layer 203, to lead out the signal of the peripheral circuit chip 202. The material of the first metal connection pillar 206 may have good conductivity and does not cause outward diffusion, such as one of gold, silver, aluminum, and copper. However, the material of the first metal connection pillar 206 is not limited to the above-mentioned, other materials having good conductivity are also applicable.

As shown in FIGS. 1 and 2, the material of the bonding pad 102 on each memory chip 101 includes metallic aluminum, i.e., the bonding pad 102 is an aluminum bonding pad. When preparing the bonding pad 102, an adhesive layer may be formed under the bonding pad 102, and an anti-reflection layer may be formed on the bonding pad 102, in order to improve electrical properties of the bonding pad and enhance the bonding between the bonding pad and the memory chip 101.

As shown in FIGS. 1 and 2, the wire bonding structures 106 are used to electrically connect the memory chips 101 to the molded substrate 110. The material of the wire bonding structures 106 is selected from metallic materials with good electrical conductivity and are easy to deform, such as one of Cu wire, Au wire, Cu alloy wire, Au alloy wire, and Cu/Au alloy wire.

As shown in FIG. 4, as an example, the material of the first encapsulating layer 107 includes one of polyimide, silicone, and epoxy resin; similarly, the material of the second encapsulating layer 204 includes one of polyimide, silicone, and epoxy resin. Top surfaces of the first encapsulating layer 107 and the second encapsulating layer 204 are both ground or polished flat surfaces, to improve the quality of the subsequently formed rewiring layers and the quality of the package body.

As shown in FIGS. 1-4, the first rewiring layer 103, the second rewiring layer 201, and the third rewiring layer 203 each includes a dielectric layer 104 and a metal wiring layer 105. The material of the dielectric layer 104 includes one or a combination of two or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 105 includes one or a combination of two or more of copper, aluminum, nickel, gold, silver, and titanium. It should be noted here that although each of the first rewiring layer 103, the second rewiring layer 201, and the third rewiring layer 203 includes a dielectric layer 104 and a metal wiring layer 105, the material, number of layers and distribution shape of the rewiring layers at different locations will be set according to actual needs and are not limited herein.

As shown in FIGS. 1-4, one of the first metal bumps 108 or one of the second metal bumps 205 includes a connecting structure, which includes a solder ball, or a metal pillar and a solder ball formed on the metal pillar. Preferably, the solder ball includes one of a gold-tin solder ball, a silver-tin solder ball, and a copper-tin solder ball. Preferably, the metal pillar is a copper pillar or a nickel pillar. In this embodiment, the first metal bumps 108 and the second metal bumps 205 are in the form of gold-tin solder balls, the manufacturing steps of which include: first forming a gold-tin layer, then using a high-temperature reflow process to reflow the gold-tin layer into a ball, and then forming a gold-tin solder ball after cooling down; or using a bumping process to form a gold-tin solder ball.

Embodiment 2

As shown in FIGS. 1-4, this embodiment provides a method of packaging a POP structure of a three-dimensional fan-out memory. The POP structure of the three-dimensional fan-out memory of Embodiment 1 can be prepared using the packaging method of this embodiment. However, the POP structure of the three-dimensional fan-out memory of Embodiment 1 can also be prepared using other packaging methods.

Specifically, FIGS. 1-4 show schematic diagrams of the structures presented in each step of the packaging method of the POP structure of the three-dimensional fan-out memory chips according to this embodiment.

As shown in FIGS. 1-3, step S1 is first performed to provide a three-dimensional fan-out memory package unit 10 and a two-dimensional fan-out peripheral circuit chip SiP package unit 20. As shown in FIG. 2, the three-dimensional fan-out memory package unit 10 includes: at least two memory chips 101, although there are three memory chips in the figures, laminated in a stepped configuration, each of the two memory chips 101 being provided with a bonding pad 102 arranged on a step surface of the stepped configuration; a molded substrate 110 having a first surface and a second surface, the first surface of which being bonded to the memory chip 101 at a bottom step of the stepped configuration; wire bonding structures 106, one end of each of the wire bonding structures 106 being electrically connected to the bonding pad 102 of the corresponding memory chip 101, and another end being electrically connected with the first surface of the molded substrate 110; a first rewiring layer 103 having a first surface over a second surface, the first surface of the first rewiring layer 103 being provided under the second surface of the molded substrate 110; a first encapsulating layer 107, encapsulating the memory chips 101 and the wire bonding structures 106; and first metal bumps 108, formed on the second surface of the first rewiring layer 103. 102 As shown in FIG. 3, the two-dimensional fan-out peripheral circuit chip SiP package unit 20 includes: a second rewiring layer 201 having a first surface over a second surface; at least one peripheral circuit chip 202, there are two of the circuit chips in the figures, arranged in two dimensions and electrically connected with the first surface of the second rewiring layer 201; a third rewiring layer 203 having a first surface over a second surface, the second surface of the third rewiring layer 203 being bonded to the at least one peripheral circuit chip 202; first metal connection pillars 206, provided on an outer side of the peripheral circuit chip 202, each of the first metal connection pillars 206 having one end electrically connected with the first surface of the second rewiring layer 201, and another end electrically connected with the second surface of the third rewiring layer 203; a second encapsulating layer 204, encapsulating the at least one peripheral circuit chip 202 and the first metal connection pillars 206; and second metal bumps 205, formed on the second surface of the second rewiring layer 201.

As shown in FIG. 4, the first metal bumps 108 are bonded to the first surface of the third rewiring layer 203 to achieve bonding of the three-dimensional fan-out memory package unit 10 to the two-dimensional fan-out peripheral circuit chip SiP package unit 20.

As shown in FIGS. 1-2, as a specific example, the method of forming the three-dimensional fan-out memory package unit 10 includes: forming the first rewiring layer 103 having the first surface and the second surface; forming the molded substrate 110 on the first surface of the first rewiring layer 103, taking the molded substrate 110 including an encapsulating layer and a metal layer as an example, a third encapsulating layer 111 may be formed on the first surface of the first rewiring layer 103, and then a second metal connection pillar 112 may be formed by photolithography and etching of the third encapsulating layer 111 and depositing of a metal layer; laminating and bonding the at least two memory chips 101 sequentially on the first surface of the molded substrate 110, such that the memory chips 101 are laminated in a stepped configuration, where the bonding of the memory chips 101 may be realized by bonding layers 109 using a surface mount process, and the bonding process may include forming a bonding layer 109 on the first surface of the molded substrate 110 and then bonding a memory chip 101 to the bonding layer 109, or forming a bonding layer 109 on a surface of a memory chip 101 at a lower step of the stepped configuration and then bonding a memory chip 101 at an upper step of the stepped configuration to the bonding layer 109; performing wire bonding between the bonding pad 102 on each one of the at least two memory chips 101 and the first surface of the molded substrate 110, to form the wire bonding structures 106, where the wire bonding structures 106 may be formed by conventional wire bonding processes, and the length, thickness, bending form and other parameters of a wire bonding structure 106 connecting each layer of memory chip 101 to the molded substrate 110 may be set according to the actual needs, as long as the electrical connection effect can be achieved without crosstalk noise; forming the first metal bumps 108 on the second surface of the first rewiring layer 103, where the first metal bumps 108 are gold-tin solder balls, and the gold-tin solder balls may be formed by firstly forming a gold-tin layer on the second surface of the first rewiring layer 103, and then using a high-temperature reflow process to reflow the gold-tin layer into a ball, and finally forming a gold-tin solder ball after cooling down, or by using a bumping process; and encapsulating the memory chips 101 and the wire bonding structures 106 by the first encapsulating layer 107, where the encapsulating method may include molding by method of compression molding, transfer molding, hydraulic molding, vacuum lamination or spin coating, and then grinding or polishing the encapsulation surface after the molding to make the surface of the encapsulation layer smooth and improve the quality.

As another specific example, the forming of the first rewiring layer 103 may include the following steps: first forming a dielectric layer using a chemical vapor deposition process or a physical vapor deposition process, and etching the dielectric layer to form a patterned dielectric layer; then forming a metal wiring layer on a surface of the patterned dielectric layer using a chemical vapor deposition process, a physical vapor deposition process, a sputtering process, an electroplating process, or a chemical plating process, and etching the metal wiring layer to form a patterned metal wiring layer. It should be noted here that the material, number of layers and distribution shape of the dielectric layer 104 and the metal wiring layer 105 can be set according to the specific conditions of different memory chips and will not be limited here.

As shown in FIG. 3, as a specific example, the method of forming the two-dimensional fan-out peripheral circuit chip SiP package unit 20 includes: forming the second rewiring layer 201 having the first surface over the second surface; electrically connecting the peripheral circuit chip 202 arranged in two dimensions to the first surface of the second rewiring layer 201; electrically connecting one end of each of the first metal connection pillars 206 to the first surface of the second rewiring layer 201, where the first metal connection pillars 206 are formed on an outer side of the at least one peripheral circuit chip 202; encapsulating the at least one peripheral circuit chip 202, as shown there are two such circuit chips, and the first metal connection pillars 206 using the second encapsulating layer 204; forming the third rewiring layer 203 having the first surface and the second surface on the peripheral circuit chip 202 and the first metal connection pillars 206, where the second surface of the third rewiring layer 203 is bonded to the at least one peripheral circuit chip 202, and another end of each of the first metal connection pillars 206 is electrically connected with the second surface of the third rewiring layer 203; and forming the second metal bumps 205 on the second surface of the second rewiring layer 201. A bottom filler layer 207 may be provided between the peripheral circuit chip 202 and the first surface of the second rewiring layer 201, to improve the bond strength between the two and to protect the second rewiring layer 201. The at least one peripheral circuit chip 202 may be bonded to the second surface of the third rewiring layer 203 by a bonding layer 208.

As an example, the method of forming the second rewiring layer 201 and the third rewiring layer 203 can be referred to the method of forming the first rewiring layer 103 above and will not be repeated herein.

As shown in FIG. 4, step S2 is then performed to bond the first metal bumps 108 to the first surface of the third rewiring layer 203 to achieve bonding of the three-dimensional fan-out memory package unit 10 to the two-dimensional fan-out peripheral circuit chip SiP package unit 20, so as to obtain the POP structure of the three-dimensional fan-out memory of the present disclosure.

In summary, the POP structure of the three-dimensional fan-out memory and the packaging method thereof according to the present disclosure adopts a fan-out pattern and realizes a package-on-package (POP) structure by multiple rewiring layers to interconnecting a three-dimensional fan-out memory package unit and a two-dimensional fan-out peripheral circuit chip SiP package unit, thereby obtaining a memory-encapsulated POP structure. In addition, the memory chip can be electrically connected to the rewiring layers by a wire bonding technique, and holes are not required in the entire package structure for any circuit lead-out, which eliminates the circuit substrate required for traditional electronic component packaging, enables for high-density and high-integration device packaging, and achieves the minimum line width/line spacing to be as low as 1.5 μm/1.5 μm. As a result, the process time will be shortened, and the process efficiency will be high. Further, the package thickness dimension can be significantly reduced. Moreover, a molded substrate is used to support the wire bonding structures, which improves the wire bonding yield and avoids damage to the rewiring layers because the molded substrate is a strong piece, so less likely to dent during wire bonding process due to its high hardness. Finally, this POP structure makes it possible to realize a one-stop packaging process in which a substrate is used to support the back-end-of-line (BEOL) instead of the middle-end-of-line (MEOL). Therefore, the present disclosure effectively overcomes various shortcomings in the existing technology and contributes to high utilization value in the industry.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge and skills in the art without departing from the spirit and technical concept disclosed by the present disclosure shall be still covered by the claims of the present disclosure.

What is claimed is:

1. A method of packaging a package-on-package (POP) structure, comprising:
    A forming a first package unit of three-dimensional fan-out memory chips, and A forming a system-in-package (SiP) package unit of two-dimensional fan-out peripheral circuit chip;
    wherein the first package unit of the three-dimensional fan-out memory chips comprises:
        at least two memory chips laminated in a stepped configuration, wherein each of the at least two memory chips is provided with a bonding pad arranged on a step surface of the stepped configuration;
        a molded substrate having a first surface and a second surface, wherein the first surface of the molded substrate is bonded to the bonding pad of one of the at least two memory chips that is at a step of the stepped configuration;
        wire bonding structures, wherein each of the wire bonding structures has one end electrically connected to the bonding pad of said memory chip, and another end electrically connected with the first surface of the molded substrate;
        a first rewiring layer having a first surface and a second surface, wherein the first surface of the first rewiring layer is provided under the second surface of the molded substrate;

a first encapsulating layer, encapsulating the at least two memory chips and the wire bonding structures; and first metal bumps, formed on the second surface of the first rewiring layer, wherein the SiP package unit of the two-dimensional fan-out peripheral circuit chip comprises:

a second rewiring layer having a first surface and a second surface;

at least one peripheral circuit chip, arranged in two dimensions and electrically connected with the first surface of the second rewiring layer;

a third rewiring layer having a first surface and a second surface, wherein the second surface of the third rewiring layer is bonded to the at least one peripheral circuit chip;

first metal connection pillars, provided on an outside of the at least one peripheral circuit chip, wherein each of the first metal connection pillars has one end electrically connected with the first surface of the second rewiring layer, and another end electrically connected with the second surface of the third rewiring layer;

a second encapsulating layer, encapsulating the at least one peripheral circuit chip and the first metal connection pillars, and second metal bumps, formed on the second surface of the second rewiring layer;

and bonding the first metal bumps to the first surface of the third rewiring layer to achieve bonding of the first package unit of the three-dimensional fan-out memory chips to the SiP package unit of the two-dimensional fan-out peripheral circuit chip.

2. The method of packaging the POP structure according to claim 1, wherein a method of forming the first package unit of the three-dimensional fan-out memory chips comprises:

forming the molded substrate;

forming the first rewiring layer on the second surface of the molded substrate;

laminating and bonding the at least two memory chips sequentially on the first surface of the molded substrate, such that the at least two memory chips are laminated in the stepped configuration;

performing wire bonding between the bonding pad of each one of the at least two memory chips and the first surface of the molded substrate, to form the wire bonding structures;

forming the first metal bumps on the second surface of the first rewiring layer; and encapsulating the at least two memory chips and the wire bonding structures by the first encapsulating layer.

3. The method of packaging the POP structure according to claim 2, wherein the laminating and bonding of the at least two memory chips sequentially on the first surface of the molded substrate is realized by a surface mount process.

4. The method of packaging the POP structure according to claim 1, wherein forming the SiP package unit of the two-dimensional fan-out peripheral circuit chip comprises:

forming the second rewiring layer having the first surface and the second surface;

electrically connecting the at least one peripheral circuit chip to the first surface of the second rewiring layer;

forming the first metal connection pillars on the first surface of the second rewiring layer, wherein the first metal connection pillars are formed on the outside of the at least one peripheral circuit chip;

encapsulating the at least one peripheral circuit chip and the first metal connection pillars using the second encapsulating layer;

forming the third rewiring layer having the first surface and the second surface on the second encapsulating layer, wherein the second surface of the third rewiring layer is bonded to the at least one peripheral circuit chip, and wherein another end of each of the first metal connection pillars is electrically connected with the second surface of the third rewiring layer; and forming the second metal bumps on the second surface of the second rewiring layer.

\* \* \* \* \*